United States Patent [19]

Cannella et al.

[11] Patent Number: 4,461,239
[45] Date of Patent: Jul. 24, 1984

[54] REDUCED CAPACITANCE ELECTRODE ASSEMBLY

[75] Inventors: Vincent D. Cannella, Detroit; Prem Nath, Rochester; Robert J. Shuman, Clawson, all of Mich.

[73] Assignee: Energy Conversion Devices, Inc., Troy, Mich.

[21] Appl. No.: 403,417

[22] Filed: Jul. 30, 1982

[51] Int. Cl.³ .................................... C23C 13/10
[52] U.S. Cl. ............................ 118/718; 118/719; 118/723; 313/257; 204/298
[58] Field of Search .............. 118/723, 718, 50.1, 118/719; 427/39; 204/298; 422/186.04; 313/257, 259, 262, 289

[56] References Cited

U.S. PATENT DOCUMENTS

| | | | |
|---|---|---|---|
| 3,598,710 | 4/1966 | Davidse | 204/298 X |
| 4,131,533 | 12/1978 | Biallco et al. | 204/298 |
| 4,287,851 | 9/1981 | Dozier | 118/723 |
| 4,351,714 | 9/1982 | Kuriyama | 204/298 |
| 4,362,611 | 12/1982 | Logan et al. | 204/298 |

*Primary Examiner*—John D. Smith
*Assistant Examiner*—Bernard F. Plantz
*Attorney, Agent, or Firm*—Lawrence G. Norris

[57] ABSTRACT

A reduced capacitance electrode assembly for use in an alternating current plasma system provides reduced input capacitance to an associated tuning network. The assembly includes an electrode adapted to receive alternating current power for maintaining a plasma region and a plurality of electrically conductive plates. The plates are closely spaced apart by less than a predetermined distance on one side of the electrode for precluding the formation of a plasma region on the one side of the electrode and for providing a plurality of series capacitances to present a substantially reduced capacitance to the alternating current power.

The reduced capacitance electrode assembly is particularly useful in a system for making photovoltaic devices wherein a plurality of amorphous semiconductor materials is deposited onto a continuous conductive substrate moving through a corresponding plurality of deposition chambers. At least one of the chambers includes a reduced capacitance electrode assembly comprising an electrode spaced from the substrate adapted to receive alternating current power for establishing a plasma between the electrode and the substrate, and a plurality of electrically conductive plates being closely spaced apart on the side of the electrode opposite the substrate for confining the plasma between the electrode and the substrate and for providing a plurality of series coupled capacitances to present a substantially reduced capacitance to the alternating current power.

19 Claims, 3 Drawing Figures

REDUCED CAPACITANCE ELECTRODE ASSEMBLY

FIELD OF THE INVENTION

This invention relates generally to alternating current plasma systems and more particularly to an electrode assembly for use in such systems which presents a substantially reduced capacitance to the alternating current power coupled to the electrode of the electrode assembly. The electrode assembly of the invention is most particularly adapted for use in radio frequency plasma systems for making amorphous semiconductor photovoltaic devices on large area substrates.

BACKGROUND OF THE INVENTION

This invention relates to alternating current plasma systems and more particularly to an electrode assembly for use in such systems of the radio frequency plasma type for continuously producing photovoltaic devices by depositing successive amorphous-silicon alloy semiconductor layers on a substrate in each of a plurality of deposition chambers. The composition of each amorphous layer is dependent upon the particular process gases introduced into each of the deposition chambers. The gases introduced into the deposition chambers are carefully controlled and isolated from the gases introduced into adjacent deposition chambers. More particularly, the deposition chambers are operatively connected by a relatively narrow gas gate passageway (1) through which the web of substrate material passes; and (2) adapted to isolate the process gases introduced into adjacent deposition chambers.

To facilitate the deposition of the amorphous silicon alloy materials onto the substrate, each chamber includes an electrode assembly having an electrode which receives alternating current power and a gas inlet for receiving the process gases. The alternating current power, in the form of radio frequency power, is coupled to the electrode to cause a plasma to be formed from the process gases to facilitate the deposition of amorphous silicon alloy materials onto a substrate. To provide coupling between the radio frequency power source and the electrode, a tuning network is placed between the source and electrode. The tuning network matches the output impedance of the source to the input impedance of the electrode.

In order to confine the plasma region between the electrode and the substrate and to prevent the formation of a plasma on the side of the electrode opposite the substrate, a shield, formed from conductive material, is disposed on the side of the electrode opposite the substrate. A bottom wall of the shield has a surface area at least as large as the surface area of the electrode and is closely spaced therefrom by a distance equal to or less than the dark space dimension to prevent a plasma from being formed between the shield and the electrode. Unfortunately, because the shield is coupled to ground potential, and by virtue of the close spacing between and the large surface areas of the electrode and the shield, a large capacitance results therebetween. This large capacitance makes it difficult to efficiently couple the radio frequency power to the electrode.

Because the electrode input impedance includes a large capacitive reactance component, large tuning networks are necessary to provide the required compensation or tuning. Also, such high capacitances result in high circulating currents, on the order of hundreds of amperes, within the tuning networks resulting in excessive $I^2R$ losses and heat problems attendant therewith. Heating problems of such magnitude have occurred in the past that water cooling has been found necessary. Also, the high circulating currents require the tuning components to be of high current rating, adding to their size and expense. It is to the end of reducing the electrode assembly capacitance that the present invention is directed.

Recently, considerable efforts have been made to develop systems for depositing amorphous semiconductor alloys, each of which can encompass relatively large areas, and which can be doped to form p-type and n-type materials for the production of p-i-n-type devices which are, in operation, substantially equivalent to their crystalline counterparts.

It is now possible to prepare amorphous silicon alloys by glow discharge techniques that have (1) acceptable concentrations of localized states in the energy gaps thereof, and (2) provide high quality electronic properties. This technique is fully described in U.S. Pat. No. 4,226,898, Amorphous Semiconductors Equivalent to Crystalline Semiconductors, Stanford R. Ovshinsky and Arun Madan which issued Oct. 7, 1980 and by vapor deposition as fully described in U.S. Pat. No. 4,217,374, Stanford R. Ovshinsky and Masatsugu Izu, which issued on Aug. 12, 1980, under the same title. As disclosed in these patents, fluorine introduced into the amorphous silicon semiconductor operates to substantially reduce the density of the localized states therein and facilitates the addition of other alloying materials, such as germanium.

The concept of utilizing multiple cells, to enhance photovoltaic device efficiency, was discussed at least as early as 1955 by E. D. Jackson, U.S. Pat. No. 2,949,498 issued Aug. 16, 1960. The multiple cell structures therein discussed utilized p-n junction crystalline semiconductor devices. Essentially the concept is directed to utilizing different band gap devices to more efficiently collect various portions of the solar spectrum and to increase open circuit voltage (Voc.). The tandem cell device has two or more cells with the light directed serially through each cell, with a large band gap material followed by a smaller band gap material to absorb the light passed through the first cell or layer. By substantially matching the generated currents from each cell, the overall open circuit voltage is increased.

It is of obvious commercial importance to be able to mass produce photovoltaic devices. Unlike crystalline silicon which is limited to batch processing for the manufacture of solar cells, amorphous silicon alloys can be deposited in multiple layers over large area substrates to form solar cells in a high volume, continuous processing system. Continuous processing systems of this kind are disclosed, for example, in U.S. Pat. No. 4,400,409 issued Aug. 23, 1983 to M. Izu et al. for A Method of Making P-Doped Silicon Films and Devices Made Therefrom; Ser. No. 244,386, filed Mar. 16, 1981 for Continuous Systems For Depositing Amorphous Semiconductor Material; U.S. Pat. No. 4,410,538, issued Oct. 18, 1983 to M. Izu et al. for Continuous Amorphous Solar Cell Production System; U.S. Pat. No. 4,438,723 issued Mar. 27, 1984 to V. D. Cannella et al. for Multiple Chamber Deposition and Isolation System and Method; and Ser. No. 359,825, filed Mar. 19, 1982 for Method And Apparatus For Continuously Producing Tandem Amorphous Photovoltaic Cells. As disclosed in these applications, a substrate may be continuously advanced through a succession of deposition chambers, wherein each chamber is dedicated to the deposition of a specific material. In making a solar cell of p-i-n-type configuration, the first chamber is dedicated for depositing a p-type amorphous silicon alloy, the second chamber is dedicated for depositing an intrinsic amorphous silicon alloy, and the third chamber is dedicated for depositing an n-type amorphous silicon alloy. Since each deposited alloy, and especially the intrinsic alloy must be of high purity, the deposition environment in the intrinsic deposition chamber is isolated from the doping constituents within the other chambers to prevent the back diffusion of doping constituents into the intrinsic chamber. In the previously mentioned patent applications, wherein the systems are primarily concerned with the production of photovoltaic cells, isolation between the chambers is accomplished by gas gates through which unidirectional gas flow is established and through which an inert gas may be "swept" about the web of substrate material.

In the previously mentioned patent applications, deposition of the amorphous silicon alloy materials onto the large area continuous substrate is accomplished by glow discharge decomposition of the process gases. To that end, each deposition chamber includes an electrode assembly for establishing the glow discharge plasma. The plasmas are maintained by an electrode which is coupled to an alternating current power source such as a radio frequency generator operating at a frequency of, for example, 13.56 megahertz. To effectively transfer the radio frequency power from the generator to the electrode, a tuning network is disposed between the generator and electrode. The tuning network matches the output impedance of the generator, which is substantially purely resistive, to the input impedance of the electrode. As previously mentioned, the input impedance of prior electrodes include a large capacitive reactance component making matching difficult. The present invention provides an electrode assembly wherein the capacitive reactance component of the electrode input impedance is substantially reduced.

It is therefore a general object of the present invention to provide a new and improved electrode assembly for use in an alternating current plasma system wherein alternating current power is transferred from a power source to an electrode by a tuning network.

It is a more particular object of the present invention to provide a new and improved electrode assembly for use in a radio frequency plasma continuous processing system for making photovoltaic devices.

It is another object of the present invention to provide such an electrode assembly which has a substantially reduced input capacitance to more readily facilitate the transfer of alternating current power to the electrode of the electrode assembly.

SUMMARY OF THE INVENTION

The invention provides a reduced capacitance electrode assembly for use in alternating current plasma systems. The assembly includes an electrode adapted to receive alternating current power for maintaining a plasma region and a plurality of electrically conductive plates. The plates are closely spaced apart by less than a predetermined distance on one side of the electrode for precluding the formation of a plasma region on the one side of the electrode and for providing a plurality of series capacitances to present a substantially reduced capacitance to the alternating current power.

The invention also provides a system for making photovoltaic devices wherein a plurality of amorphous semiconductor materials is deposited onto a continuous conductive substrate moving through a corresponding plurality of deposition chambers. At least one of the chambers includes a reduced capacitance electrode assembly comprising an electrode spaced from the substrate adapted to receive alternating current power for establishing a plasma between the electrode and the substrate, and a plurality of electrically conductive plates being closely spaced apart on the side of the electrode opposite the substrate for confining the plasma between the electrode and the substrate and for providing a plurality of series coupled capacitances to present a substantially reduced capacitance to the alternating current power.

DETAILED DESCRIPTION OF THE DRAWINGS

I. The Photovoltaic Cell

Figure 1:
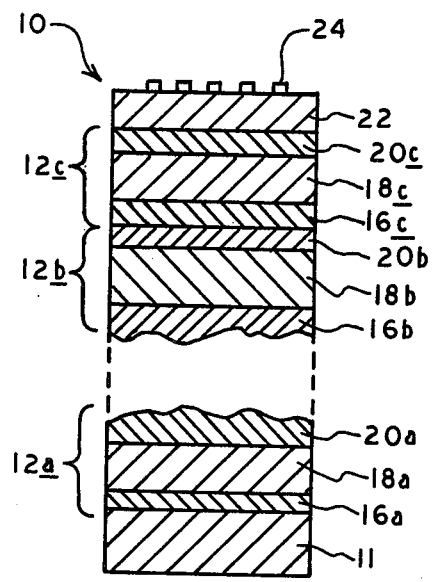
FIG. 1 is a fragmentary, cross-sectional view of a tandem or cascade photovoltaic device comprising a plurality of p-i-n-type cells, each layer of the cells formed from an amorphous semiconductor alloy in accordance with the principles of the present invention.

Referring now to the drawings and particularly to FIG. 1, a photovoltaic cell, formed of a plurality of successive p-i-n layers, each of which includes an amorphous semiconductor alloy, is shown generally by the numeral 10. It is for the production of this type of photovoltaic device, wherein amorphous alloy layers are continuously deposited onto a moving web of substrate material in successive isolated deposition chambers, that the reduced capacitance electrode assembly of the present invention is most applicable.

More particularly, FIG. 1 shows a p-i-n-type photovoltaic device such as a solar cell made up of individual p-i-n-type cells 12a, 12b and 12c. Below the lowermost cell 12a is a substrate 11 which may be transparent or formed from a metallic material such as stainless steel, aluminum, tantalum, molybdenum or chromium. Although certain applications may require a thin oxide layer and/or a series of base contacts prior to application of the amorphous material, for purposes of this application, the term "substrate" shall include not only a flexible film, but also any elements added thereto by preliminary processing.

Each of the cells 12a, 12b and 12c are fabricated with an amorphous alloy body containing at least a silicon alloy. Each of the alloy bodies includes an n-type conductivity region or layer 20a, 20b and 20c; an intrinsic region or layer 18a, 18b and 18c; and a p-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although p-i-n cells are illustrated, the reduced capacitance electrode assembly of this invention may also be used with apparatus adapted to produce single or multiple n-i-p cells.

It is to be understood that following the deposition of the semiconductor alloy layers, a further deposition process may be either performed in a separate environment or as a part of a continuous process. In this step, a TCO (transparent conductive oxide) layer 22 is added. An electrode grid 24 may be added to the device where the cell is of a sufficiently large area, or if the conductivity of the TCO layer 22 is insufficient. The grid 24 shortens the carrier path and increases the collection efficiency.

II. The Multiple Glow Discharge Deposition Chambers

Figure 2:
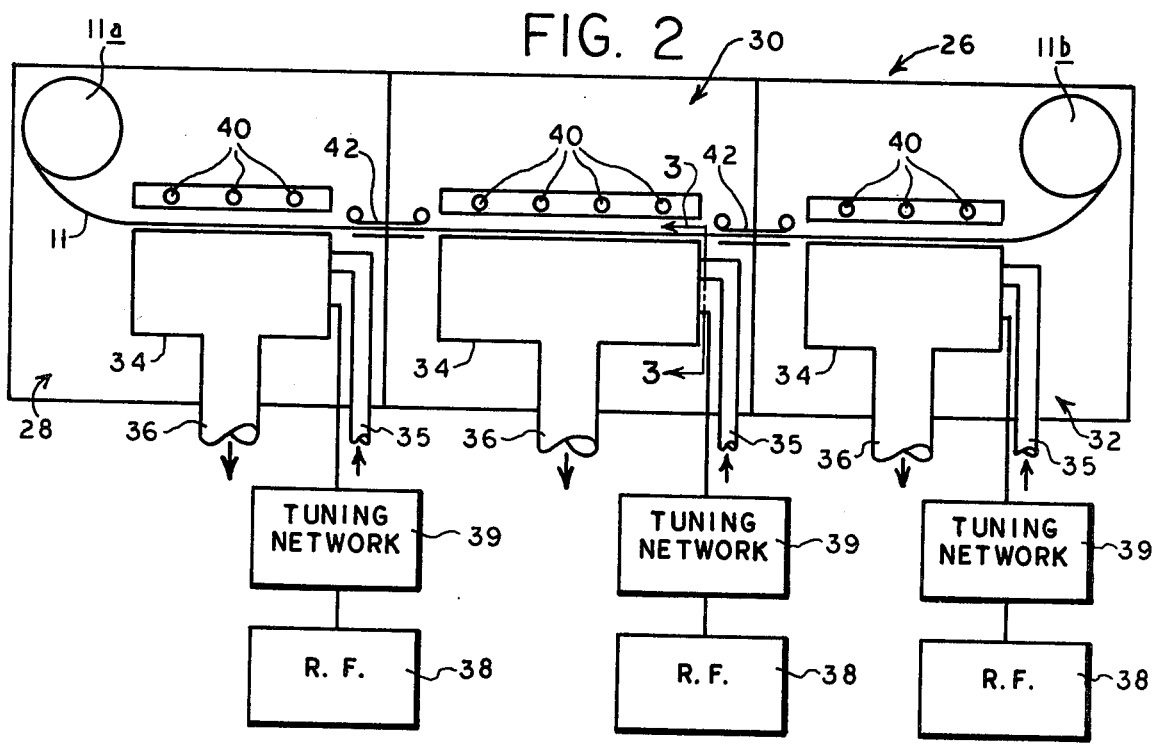
FIG. 2 is a diagrammatic representation of a multiple glow discharge chamber deposition system adapted for the continuous production of the photovoltaic devices shown in FIG. 1, which system includes electrode assemblies in accordance with the present invention.

Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which a sweep gas flows in a non-violant manner.

The apparatus 26 is adapted to produce a high volume of large area, amorphous photovoltaic cells having a p-i-n configuration on the deposition surface of a substrate material 11 which is continually fed therethrough. To deposit the amorphous alloy layers required for producing multiple p-i-n-type layer cells, the apparatus 26 includes at least one triad of deposition chambers. Each triad comprising: a first deposition chamber 28 in which a p-type conductivity amorphous alloy layer is deposited onto the deposition surface of the substrate 11 as the substrate 11 passes therethrough; a second deposition chamber 30 in which an intrinsic amorphous alloy layer is deposited atop the p-type alloy layer on the deposition surface of the substrate 11 as the substrate 11 passes therethrough; and a third deposition chamber 32 in which an n-type conductivity alloy layer is deposited atop the intrinsic layer on the deposition surface of the substrate 11 as the substrate 11 passes therethrough. It should be apparent that, (1) although, only one triad of deposition chambers has been illustrated, additional triads or additional individual chambers may be added to the apparatus to provide the machine with the capability of producing photovoltaic cells having any number of amorphous p-i-n-type layers; and (2) the substrate supply core 11a and the substrate take-up core 11b are shown in the deposition chambers for illustrative purposes only, while in reality the cores would be housed in separate chambers operatively connected to the deposition chambers.

Each deposition chamber 28, 30 and 32 of the triad is adapted to deposit a single amorphous silicon alloy, by glow discharge deposition onto the conductive substrate 11. To that end, each of the deposition chambers 28, 30 and 32 includes: an electrode assembly 34; a gas supply conduit 35; an out gassing conduit 36; a radio frequency generator 38; a tuning network 39; a plurality of radiant heating elements 40; and a gas gate 42 operatively connecting the intrinsic deposition chamber to each of the dopant chambers. The supply conduits 35 are operatively associated with the respective electrode assemblies 34 to deliver process gas mixtures to the plasma regions created in each deposition chamber.

The radio frequency generators 38 operate in conjunction with the electrode assemblies 34, the radiant heaters 40 and the grounded substrate 11 to form the plasma regions by dissociating the elemental reaction gases entering the deposition chambers into deposition species. The deposition species are then deposited onto a surface of the substrate 11 as amorphous semiconductor layers.

The tuning networks 39 match the output impedance of the generators 38 to the input impedance of the electrode assemblies 34. This provides efficient power transfer between the generators 38 and the electrode assemblies 34. As will be apparent hereinafter, the new and improved electrode assembly of the present invention presents a substantially reduced input capacitance to which the networks 39 must match. As previously mentioned, this not only reduces the physical size of the networks, but also, the circulating currents within the networks.

To form the photovoltaic cell 10 illustrated in FIG. 1, a p-type amorphous silicon layer is deposited onto the substrate 11 in the deposition chamber 28, an intrinsic amorphous silicon alloy layer is deposited atop the p-type layer in the deposition chamber 30 and an n-type amorphous silicon alloy layer is deposited atop the intrinsic layer in the deposition chamber 32. As a result, the apparatus 26, deposits at least three amorphous silicon alloy layers onto the substrate 11 wherein the intrinsic layer deposited in deposition chamber 30 differs in composition from the layers deposited in deposition chambers 28 and 32 by the absence of at least one element which will be referred to as the dopant or doping species.

It is important that each of the alloy layers (and particularly the intrinsic layer) deposited onto a surface of the substrate 11 be of high purity in order to produce high efficiency photovoltaic devices 10. The gas gates 42 substantially prevent the back diffusion of process gases from the dopant chambers into the intrinsic deposition chamber.

III. The Reduced Capacitance Cathode Assemblies

Figure 3:
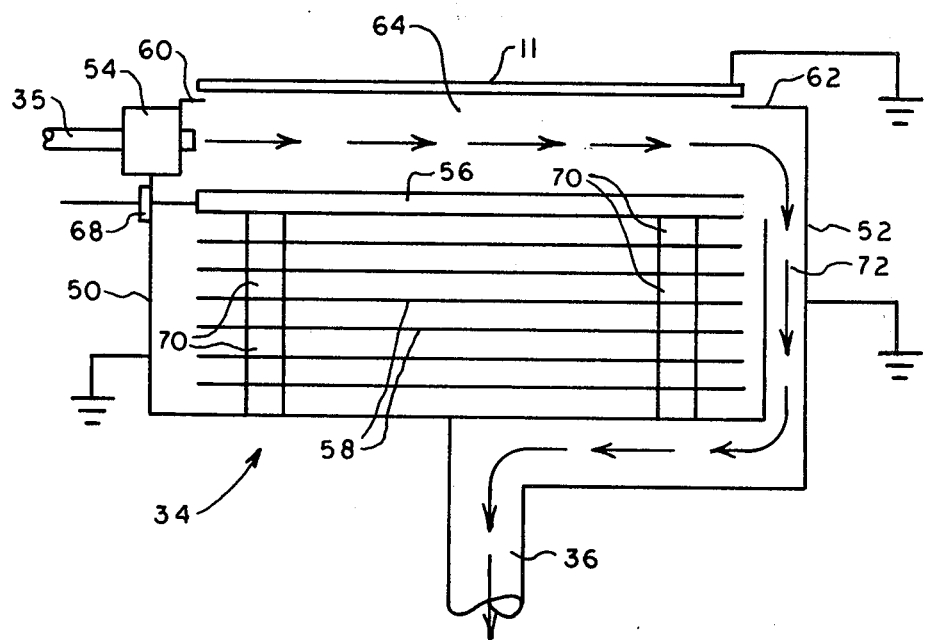
FIG. 3 is an enlarged side view, partly in cross-section, of an electrode assembly of FIG. 2 as seen along lines 3—3 of FIG. 2.

Referring now to FIG. 3, there is illustrated an electrode assembly 34 embodying the present invention shown in operative relation with respect to a substrate 11 upon which an amorphous semiconductor material is being deposited. The assembly 34 generally includes a shield 50, an outer housing portion 52, a gas feed manifold 54, an electrode 56, and a plurality of electrically conductive plates 58.

The substrate 11 is disposed above the assembly 34 and is closely spaced from a pair of horizontal extensions 60 and 62 of the shield 50 and outer housing portion 52, respectively. The substrate slightly overlaps these extensions to confine the plasma formed in a region 64 between the electrode 56 and the substrate 11.

The electrode 56 is disposed beneath the substrate 11 by a distance greater than the dark space dimension to permit the establishment of a plasma in region 64. To maintain the plasma, the supply gases are introduced into the region 64 through the gas feed manifold 54 which is in turn supplied with the supply gases through a supply conduit 35. Also, the electrode 56 is coupled to a source of alternating current power, preferably in the form of radio frequency power, through a high current feed through 68 disposed within one sidewall of the shield 50. Preferably, the electrode is coupled to a radio frequency generator, such as a generator 38 of FIG. 2, by a tuning network. The feed through 68 insulates the electrode and alternating current power from the shield 50.

The conductive plates 58 are closely spaced apart and supported from the bottom wall of the shield 50 on the side of the electrode 56 opposite the substrate 11. The plates 58 are supported by a plurality of insulating spacers 70 which can be formed from ceramic material, for example. The spacing between the plates and the top most plate and the electrode 56 is less than a predetermined distance, herein referred to as the dark space distance or dimension, to prevent the formation of a plasma on the side of the electrode 56 opposite the substrate 11. This assures confinement of the generated plasma to the region 64. As illustrated in FIG. 3, the plates are preferably equally spaced, but need not be.

The sidewalls and bottom wall of the shield 50 substantially enclose the electrode 56 and the plates 58. The sidewall of shield 50 opposite the feed through 68 form with the outer housing portion 52 a passageway 72 through which the unused reaction gases pass to the out gassing conduit 36.

As can be noted, the substrate 11, shield 50, and outer housing 52 are all coupled to ground potential. The electrode 56, plates 58 and the bottom wall of the shield 50 are all substantially planar and lie in substantially parallel planes. The plates, as a result, form a plurality of series coupled capacitors between the electrode 56 and ground potential. As a result, the capacitance from the electrode 56 to ground potential is substantially reduced over prior art structures wherein only a shield, closely spaced from the electrode, was utilized to prevent the formation of a plasma on the side of the electrode opposite the substrate.

As a specific example of how the electrode assembly of the present invention presents a reduced capacitance to the alternating current power or tuning network, for an electrode and shield which are parallel, the capacitance from the electrode to ground is given by the relationship:

$$C = (K\epsilon_0 A)/d$$

where;

C is the capacitance in farads,
K is the dielectric constant of the medium between the shield and electrode,
A is the surface area,
d is the spacing between the electrode and shield, and
$\epsilon_0$ is a constant equal to $8.85 \times 10^{-12}$ farads/meter.

For a prior art electrode assembly where the surface area of the electrode and shield is 0.35 square meters, the electrode to shield spacing is 5 millimeters, and the deposition is performed under a pressure of about 0.5 Torr making the dielectric constant equal to unity, the capacitance from the electrode to ground will be about 620 picofarads (PF). However, by practicing the present invention and incorporating only three plates having surface areas equal to the surface areas of the electrode and shield and spaced apart by the spacing of 5 millimeters, the capacitance from the electrode to ground can be reduced by a factor of four to about 155 picofarads. This results because the three plates establish four series coupled capacitors, each having a capacitance of about 620 picofarads, between the electrode and ground. In practice, and for all the reasons previously mentioned, an electrode having a capacitance of 155 picofarads can be much more readily tuned than one having a capacitance of 620 picofarads.

It is, of course, not necessary that the plates be equally spaced apart and therefore the capacitance of the individual capacitors formed by the plates be equal in value. Additionally, the plates need not be planar as illustrated and can vary in number from that disclosed herein without departing from the present invention.

The reduced capacitance electrode assembly of the present invention therefore presents an input impedance to the tuning network which has a substantially reduced capacitive reactance component than prior art electrode assemblies. As a result, the tuning network can be considerably smaller because it has less capacitance to compensate for. Also, the circulating currents within the network are substantially reduced allowing smaller diameter wire to be used for the network wiring. Also, the voltage from the electrode 56 to ground is more evenly distributed to prevent arcing between the electrode and the grounded components of the assembly.

The electrode assembly of the present invention can also be utilized to advantage in systems other than the radio frequency glow discharge decomposition systems disclosed herein, such as in sputtering systems. In fact, the electrode assembly of the present invention can be advantageously employed in any alternating current power plasma system wherein efficient transfer of alternating current power to an electrode is required and electrode tuning is a consideration.

While for purposes of illustration, a preferred embodiment of this invention has been disclosed, other forms and embodiments thereof may become readily apparent to those ordinarily skilled in the art upon reference to this disclosure and, therefore, this invention is intended to be limited only by the scope of the appended claims.

What we claim for U.S. Letters Patent is:

1. A reduced capacitance electrode assembly for use in alternating current electrode powered plasma systems, said assembly comprising:
    an electrode adapted to receive alternating current power for maintaining a plasma region; and
    a plurality of electrically conductive plates, said plates being closely spaced apart by less than a predetermined distance on one side of said electrode for precluding the formation of a plasma region on said one side of said electrode and for providing a plurality of serial capacitances with said electrode to present a substantially reduced capacitance to said alternating current power.

2. An assembly as defined in claim 1 further including a conductive shield substantially enclosing said plurality of plates, said shield having a bottom wall closely spaced from the plate most distant from said electrode, and said shield being coupled to ground potential.

3. An assembly as defined in claim 2 further comprising a plurality of insulating spacers between said plates for supporting and maintaining said plates in said closely spaced apart relation between said electrode and said shield bottom wall.

4. An assembly as defined in claim 3 wherein said electrode, said plates, and said shield bottom wall are substantially planar.

5. An assembly as defined in claim 3 wherein said spacers are formed from ceramic material.

6. A reduced capacitance electrode assembly for use in depositing amorphous semiconductor materials onto a large area conductive substrate, said assembly comprising:
    an electrode spaced from said substrate adapted to receive alternating current power for establishing a plasma between said electrode and said substrate; and a plurality of conductive plates, said plates being closely spaced apart on the side of said electrode opposite said substrate for confining said plasma to a region between said electrode and said substrate and for providing a plurality of series coupled capacitances in series with said electrode to present to said radio frequency power a substantially reduced capacitance.

7. An assembly as defined in claim 6 wherein said plates are substantially planar and parallel to said electrode.

8. An assembly as defined in claim 7 further comprising a conductive shield substantially enclosing said plates having a pair of sidewalls and a bottom wall substantially parallel to and spaced from said electrode.

9. An assembly as defined in claim 8 further comprising a plurality of insulative spacers for supporting said plates within said shield in said spaced apart relation.

10. An assembly as defined in claim 9 wherein said spacers are formed from ceramic material.

11. An assembly as defined in claim 8 wherein said shield is coupled to ground potential.

12. An assembly as defined in claim 8 wherein one of said shield sidewalls includes a high current feed through for coupling said electrode to said radio frequency power while insulating said electrode from said shield.

13. In a system for making photovoltaic devices wherein a plurality of amorphous semiconductor materials is deposited onto a continuous conductive substrate moving through a corresponding plurality of deposition chambers, the improvement of at least one of said chambers including a reduced capacitance electrode assembly comprising:

an electrode spaced from said substrate adapted to receive alternating current power for establishing a plasma between said electrode and said substrate; and a plurality of electrically conductive plates, said plates being closely spaced apart on the side of said electrode opposite said substrate for confining said plasma between said electrode and said substrate and for providing a plurality of series coupled capacitances in series with said electrode to present a substantially reduced capacitance to said alternating current power.

14. A system as defined in claim 13 further including a conductive shield substantially enclosing said plurality of plates, said shield having a bottom wall closely spaced from the plate most distant from said electrode.

15. A system as defined in claim 14 wherein said electrode, said plates, and said shield bottom wall are substantially planar and disposed in substantially parallel relation.

16. A system as defined in claim 15 further comprising a plurality of insulating spacers for supporting said plates within said shield in said spaced apart relation.

17. A system as defined in claim 16 wherein said spacers are formed from ceramic material.

18. A system as defined in claim 14 wherein said shield is coupled to ground potential.

19. A system as defined in claim 18 wherein said shield includes a pair of opposed sidewalls and wherein one of said sidewalls includes a high current feed through for coupling said alternating current power to said electrode while insulating said electrode from said shield.

* * * * *